United States Patent
Li et al.

(10) Patent No.: US 6,506,685 B2
(45) Date of Patent: Jan. 14, 2003

(54) PERFORATED PLASMA CONFINEMENT RING IN PLASMA REACTORS

(75) Inventors: Lumin Li, Santa Clara, CA (US); George Mueller, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 189 days.

(21) Appl. No.: 09/728,733

(22) Filed: Nov. 30, 2000

(65) Prior Publication Data

US 2001/0000104 A1 Apr. 5, 2001

Related U.S. Application Data (63) Continuation of application No. 09/222,588, filed on Dec. 28, 1998, now Pat. No. 6,178,919.

(51) Int. Cl.[7] .......................... H01L 21/00; C23F 1/100; H05H 1/00; C23C 16/00
(52) U.S. Cl. ..................... 438/710; 427/569; 216/67; 156/345.47; 118/723 E
(58) Field of Search .................. 118/723 E, 723 I; 156/345.47, 345.48; 204/298.11; 315/111.21; 438/710; 427/569; 216/67

(56) References Cited

U.S. PATENT DOCUMENTS

| | | |
|---|---|---|
| 4,464,223 A | 8/1984 | Gorin |
| 4,632,719 A | 12/1986 | Chow et al. |
| 5,006,192 A | 4/1991 | Deguchi |
| 5,534,751 A | 7/1996 | Lenz et al. |
| 5,605,637 A | 2/1997 | Shan et al. |
| 5,900,103 A | 5/1999 | Tomoyasu et al. |
| 5,998,932 A | 12/1999 | Lenz |
| 6,019,060 A | 2/2000 | Lenz |
| 6,051,100 A | 4/2000 | Walko, II |
| 6,074,518 A | 6/2000 | Imafuku et al. |

FOREIGN PATENT DOCUMENTS

| | | |
|---|---|---|
| EP | 0 678 903 | 10/1995 |
| EP | 0 814 495 | 12/1997 |
| EP | 0 821 395 | 1/1998 |
| GB | 2 251 977 | 7/1992 |
| JP | 07-245295 A | 9/1995 |

*Primary Examiner*—Gregory Mills
*Assistant Examiner*—P. Hassanzadeh
(74) *Attorney, Agent, or Firm*—Beyer Weaver & Thomas, LLP (57) ABSTRACT

The invention relates to a plasma processing reactor apparatus for semiconductor processing a substrate. The apparatus includes a chamber. The apparatus further includes a top electrode configured to be coupled to a first RF power source having a first RF frequency and a bottom electrode configured to be coupled to second RF power source having a second RF frequency that is lower than the first RF frequency. The apparatus additionally includes an insulating shroud that lines an interior of the chamber, the insulating shroud being configured to be electrically floating during the processing. The apparatus further includes a perforated plasma confinement ring disposed outside of an outer periphery of the bottom electrode, a top surface of the perforated plasma confinement ring being disposed below a top surface of the substrate and electrically grounded during the processing.

18 Claims, 5 Drawing Sheets

PERFORATED PLASMA CONFINEMENT RING IN PLASMA REACTORS

CROSS REFERENCE TO RELATED APPLICATION

This application is a continuation of 09/222,588, filed Dec. 28, 1998, now U.S. Pat. No. 6,178,919, issued Jan. 30, 2001, which is hereby incorporated by reference.

BACKGROUND OF THE INVENTION

The present invention relates to the fabrication of semiconductor integrated circuits (IC's). More particularly, the present invention relates to an improved apparatus and method for etching through a silicon-dioxide containing material, during IC fabrication to create etched features (e.g., trenches, contacts or vias) on the substrate surface.

During the manufacture of a semiconductor-based product, for example, a flat panel display or an integrated circuit, multiple deposition and/or etching steps may be employed. During the deposition step, materials are deposited onto a substrate surface (such as the surface of a glass panel or a wafer). Conversely, etching may be employed to selectively remove materials from predefined areas on the substrate surface. Etching in this manner can create etched features in the dielectric layers of a substrate,surface wherein the etched features are filled with metal to form a conductive path.

During etching, a mask formed of a suitable mask material, such as photoresist, is typically employed to define the areas to be etched in the underlying layer. In an exemplary photoresist technique, the photoresist material is first deposited on the underlying layer to be etched. The photoresist material is then patterned by exposing the photoresist material in a suitable lithography system, and by developing the photoresist material to form a mask to facilitate subsequent etching. Using an appropriate etchant, areas of the underlying layer that are unprotected by the mask may then be etched away using an appropriate etchant source gas, thereby forming etched features such as trenches, contacts or vias in the underlying layer.

Figure 1:
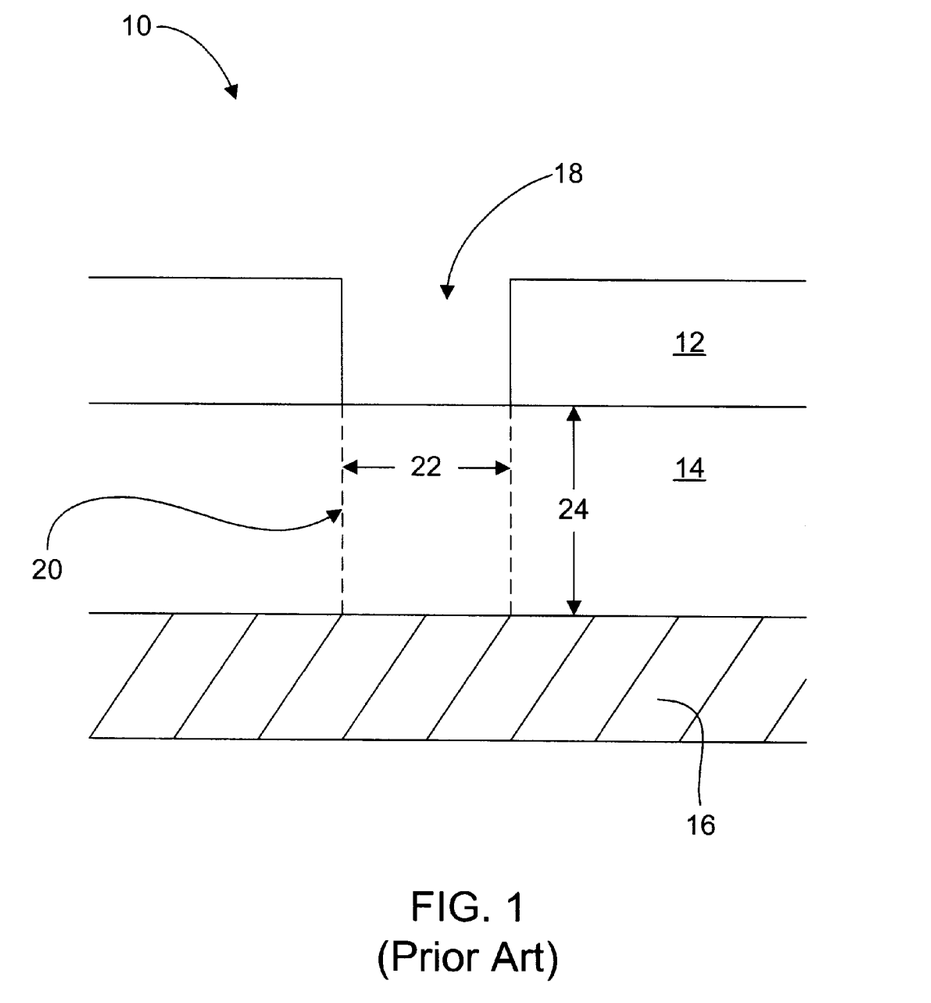
FIG. 1 illustrates a cross sectional view of a substrate layer, representing the layers involved in the etching of a typical semiconductor IC that includes a silicon dioxide layer.

To facilitate discussion, FIG. 1 depicts an exemplary substrate stack 10, including a mask 12, an underlying layer 14 and a substrate 16. As mentioned, mask 12 may represent photoresist mask or it may be formed of any suitable mask material, including hard mask materials. Underlying layer 14 represents the layer or layers to be etched. For ease of discussion, the underlying layer represents herein a dielectric layer (e.g., a doped or undoped silicon dioxide-containing layer) although, depending on the specific application, the underlying layer may be formed of any etchable material including, for example, organic material. Substrate 16 includes the layers and features that underlie the layer to be etched and may include the semiconductor wafer or the glass panel itself. For the purposes of the invention herein, the composition substrate 16 is somewhat irrelevant.

Within mask 12, there is shown an opening 18, which is created during the mask patterning process. Through opening 18, plasma generated etchants react with the material of underlying layer 14 to etch features (e.g., trenches, contacts or vias) in the underlying layer. During this etching process, the etchants tend to anisotropically etch underlying layer 14 through opening 18 in mask 12, forming an etched feature 20 (e.g., trenches, contacts or vias) having a diameter 22 (or width) and a depth 24. The diameter (or width) is the feature size. The aspect ratio is the ratio of depth over the feature size.

To achieve greater circuit density, modern integrated circuits are scaled with increasingly narrower design rules. As a result, the need for high aspect ratios for features (e.g., trenches, contacts or vias) and substantially straight profiles between devices on the integrated circuit has steadily increased. By way of example, it is not uncommon to employ design rules as small as 0.18 microns or even smaller in the fabrication of some high density integrated circuits. As adjacent devices are packed more closely together, the need for high aspect ratios and straight profiles are increased. The higher aspect ratios allow the feature size (diameter or width) to be smaller thereby allowing closer packing. Additionally, straight profiles ensure that subsequently deposited metal material can properly fill the etched feature, e.g., without suffering voids due to pinch-offs, or the like.

In view of the foregoing, these are desired: improved methods and apparatuses for etching features with high aspect ratios and more vertically etched profiles.

SUMMARY OF THE INVENTION

The invention relates, in one embodiment, to a plasma processing reactor apparatus for semiconductor processing a substrate. The apparatus includes a chamber. The apparatus further includes a top electrode configured to be coupled to a first RF power source having a first RF frequency and a bottom electrode configured to be coupled to second RF power source having a second RF frequency that is lower than the first RF frequency. The apparatus additionally includes an insulating shroud that lines an interior of the chamber, the insulating shroud being configured to be electrically floating during the processing. The apparatus further includes a perforated plasma confinement ring disposed outside of an outer periphery of the bottom electrode, a top surface of the perforated plasma confinement ring being disposed below a top surface of the substrate and electrically grounded during the processing.

The invention relates, in another embodiment, to a perforated plasma confinement ring device configured for grounding electrons inside a plasma processing reactor during processing. The apparatus includes a conductive ring having an inner and outer diameter, the inner diameter being dimensioned to surround an electrode in the plasma processing reactor, the conductive ring being electrically grounded during the processing. The apparatus further includes a plurality of perforations in the conductive ring, the plurality of perforations being dimensioned to permit by-product gases from the processing to pass through while substantially confining a plasma.

The invention relates, in yet another embodiment, to a method of etching a substrate in semiconductor processing. The method includes providing a plasma processing reactor that includes a process chamber, a top electrode coupled to a first RF power source, a bottom electrode coupled to a second RF power source, a perforated plasma confinement ring coupled to ground, an insulating shroud, a process gas and a substrate. The method further includes filling the process chamber with the process gas and energizing the process gas with the top electrode such that a plasma is formed inside the process chamber. The method additionally includes grounding the plasma with the perforated plasma confinement ring and removing by-product gases the processing through a plurality of perforations in the perforated plasma confinement ring.

These and other features of the present invention will be described in more detail below in the detailed description of the invention and in conjunction with the following figures.

DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, higher aspect ratios and substantially straight profiles for etched features in the silicon dioxide layer are achieved by introducing a perforated plasma confinement ring to a plasma processing reactor. The term "etched features" herein encompasses e.g., trenches, contacts, vias or the like. The etching takes place while the substrate is disposed on a chuck within the plasma processing chamber. A process gas, which is input into a plasma processing chamber, is energized with RF power supplied to an electrode wherein the RF energy dissociates the gas thereby creating a plasma. Power is then supplied to another electrode and the ions are accelerated towards the substrate. The accelerated ions and the plasma generated etchants etch the substrate. In general, when the plasma density is high, the ion energy tends to be low. By introducing a perforated plasma confinement ring coupled to ground into the plasma processing chamber, electrons from the plasma are substantially removed and the plasma density is reduced, thereby increasing ion energy. The increase in ion energy tends to produce a better etch.

In another embodiment, the perforated plasma confinement ring is dimensioned to permit by-product gases, during processing, to pass through while substantially confining a plasma within a volume defined by the processing chamber. By confining the plasma inside the process chamber, a more uniform etch can be achieved, wherein the center and the edge of the substrate have substantially the same etch rates.

In another embodiment, the perforated plasma confinement ring is placed at a location inside the processing chamber where it can exhaust by-product gas efficiently without causing contamination of the substrate. Particle contamination is created by the disturbance of flow of the by-product gas and therefore placement is critical for reducing particulate contamination.

In accordance with one embodiment of the present invention, there is provided an insulating shroud within the plasma processing chamber. The insulating shroud lines the interior of the chamber. The insulating shroud is configured to be electrically floating, which prevents the plasma from grounding through the chamber walls. The insulating shroud also has the purpose of confining the plasma to a specific volume inside the chamber.

Figure 2:
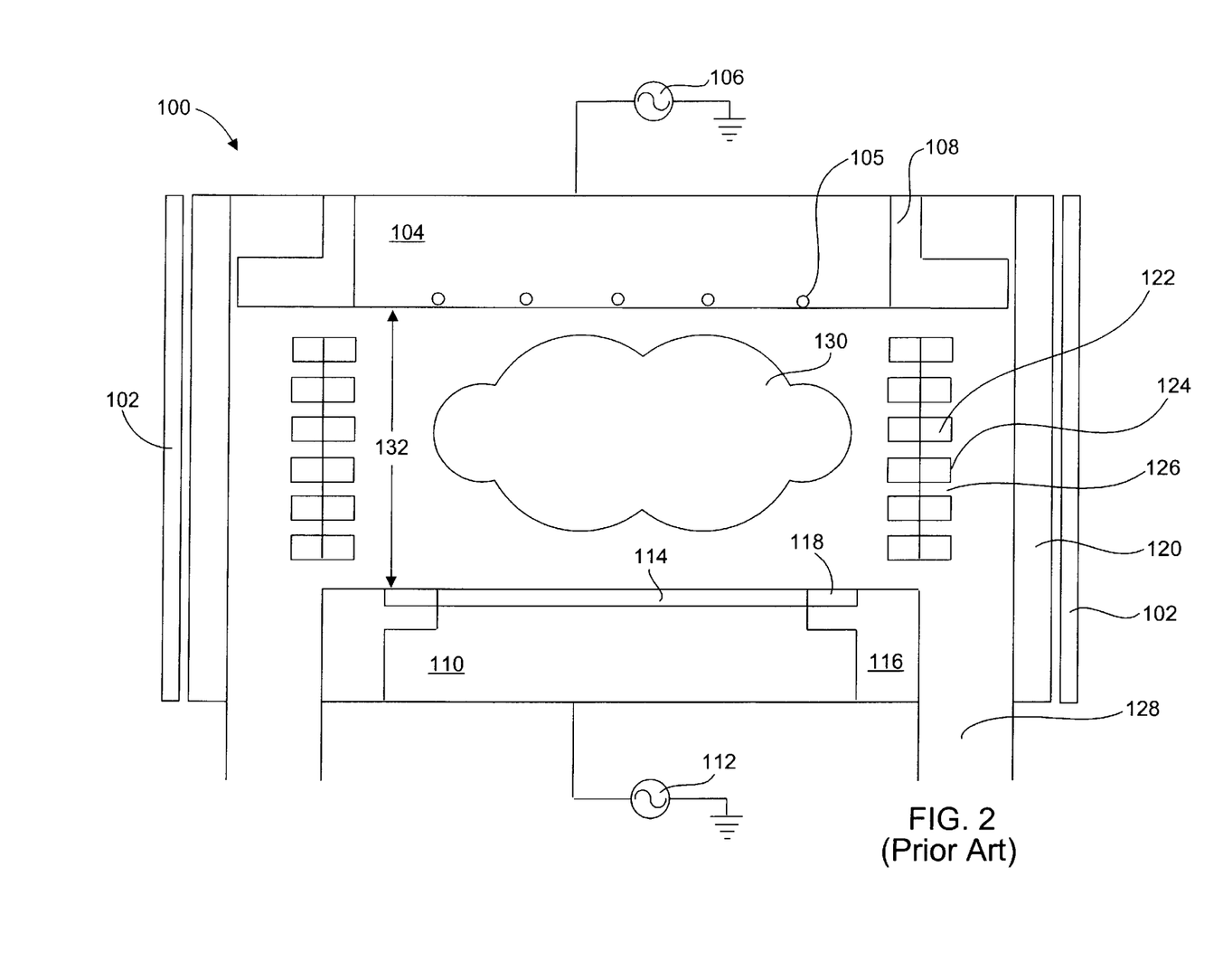
FIG. 2 is a schematic diagram of a prior art plasma processing reactor.

To further discuss the features of the inventions and their advantages over the prior art, FIG. 2 illustrates a prior art plasma processing reactor. FIG. 2 depicts a parallel plate reactor 100, with a chamber wall 102. The chamber wall 102 has the option of being coupled to ground or floating. A top electrode 104 is coupled to a first RF power source 106 having a first RF frequency. Top electrode 104 includes a multiplicity of gas distribution apertures 105. However, these gas distribution apertures may alternatively or additionally be disposed at other locations e.g., the chamber side walls. Gas distribution apertures 105 allow the passage of process gas into the process chamber. Top electrode 104 is surrounded by a top shroud 108. However, top shroud 108 is optional and may be omitted. A bottom electrode 110 is coupled to a second RF power source 112 having a second RF frequency. Bottom electrode 110 represents an electrostatic chuck that secures substrate 114. A focus ring 116 surrounds bottom electrode 110 and is made of a ceramic material such as aluminum oxide. Focus ring 116 tends to focus the plasma towards the substrate particularly at the periphery of the substrate to improve etch uniformity. A silicon ring 118 surrounds the edge of substrate 114. The silicon ring prevents contamination of substrate 114 from the aluminum oxide or ceramic materials of focus ring 116.

A teflon shroud 120 lines the interior of chamber wall 102. A confinement ring 122 comprising concentric rings 124 and spaces 126 surrounds the process chamber inside teflon shroud 120. Confinement ring 122 allows gas to escape and be exhausted out of port 128. Confinement ring 122 is floating and made out of an insulating material.

A plasma 130 is created during processing and confined in the chamber by top electrode 104, substrate 114, focus ring 116, silicon ring 118, and confinement ring 122. A distance 132 can be varied by moving the top electrode 104 up and down. The top electrode moves up to permit substrate 114 to be disposed on bottom electrode 110 and down in order to process it. Distance 132 is held at a predefined distance during processing. A height adjustment is achieved by utilizing a screw linear actuator (not shown), which moves the entire top of the chamber up or down.

Figure 3:
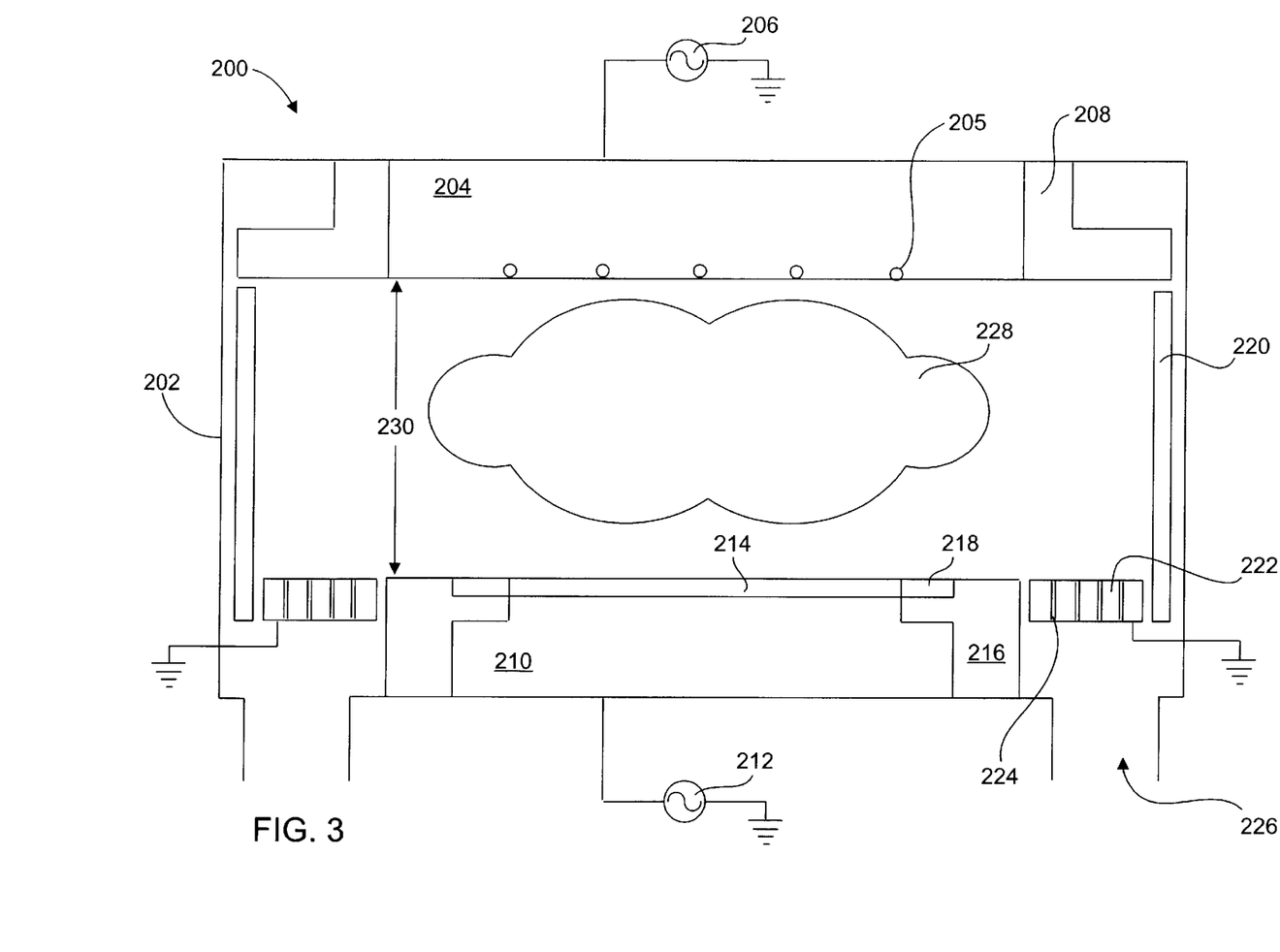
FIG. 3 is a schematic diagram of a plasma processing reactor with the enhancements of the present invention.

In accordance with one aspect of the present invention, the plasma density is reduced, in order to increase ion energy, by the addition and specific placement of a perforated plasma confinement ring. To facilitate discussion of this aspect of the present invention, FIG. 3 depicts a parallel plate reactor 200, with a chamber wall 202. Chamber wall 202 has the option of being coupled to ground or electrically floating. A top electrode 204 is coupled to a first RF power source 206 having a first RF frequency of about 27 MHz. Top electrode 204 may include a multiplicity of gas distribution apertures 205. However, these gas distribution apertures may alternatively or additionally be disposed at other locations e.g., the chamber side walls. Gas distribution apertures 205 allow the passage of process gas into the process chamber. Top electrode 204 maybe surrounded by a top shroud 208. However, top shroud 208 is optional and may be omitted. A bottom electrode 210 is coupled to a second RF power source 212 having a second RF frequency of about 2 MHz. The second RF frequency should be lower than the first RF frequency.

The bottom electrode represents, in this case, an electrostatic chuck that secures the substrate 214. However, bottom electrode 210 can represent any suitable work piece holder e.g., a mechanical-type chuck, a vacuum chuck, and the like. A focus ring 216, which is optional, is disposed around the outer periphery of bottom electrode (electrostatic chuck) 210 and is made of a ceramic material such as aluminum oxide. Focus ring 216 tends to focus the plasma towards the substrate particularly at the periphery of the substrate to improve etch uniformity. A silicon ring 218, which is optional, surrounds the edge of substrate 214. As mentioned, the silicon ring prevents contamination of substrate 214 from the aluminum oxide or ceramic materials of focus ring 216.

An insulating shroud 220 is electrically floating and formed from a material that is substantially resistant to etching by a plasma present within the chamber during the etching of substrate 214. Insulating shroud 220 lines the interior of the chamber. A perforated plasma confinement ring 222 is electrically grounded and formed from a conductor that is, also substantially resistant to etching by a plasma within the chamber during the etching of substrate 214. Perforated plasma confinement ring 222 has perforations 224 through it to allow by-product gas to escape and to be exhausted out of port 226. Perforated plasma confinement ring 222 is preferably disposed outside of the outer periphery of bottom electrode 210 and abutted to focus ring 216, if the focus ring is present. Also, perforated plasma confinement ring 222 is disposed below the top surface of substrate 214 to reduce the amount of contamination that would occur if it were above substrate 214. It is believed that the placement of the perforated plasma confinement ring in this manner also contributes to etch uniformity.

A plasma 228 is created during processing and confined in a volume defined by top electrode 204, substrate 214, insulating shroud 220, perforated plasma confinement ring 222, focus ring 216 and silicon ring 218, if the focus ring and the silicon ring are present. Preferably, plasma 228 is substantially isolated from chamber wall 202. A distance 230 between the top and bottom electrodes is adjustable before, during and after processing. Top electrode 204 moves up to permit a substrate 214 to be disposed on bottom electrode 210 and down in order to process it. Distance 230 is held at a predefined distance during processing. The height adjustment is achieved by utilizing a screw linear actuator (not shown) which moves the entire top of the chamber up or down. The first RF power source is coupled to a high pass filter (not shown) which allows the second RF power of the bottom electrode to be grounded while blocking the RF power of the top electrode. The second RF power source is coupled to a low pass filter (not shown) which allows the RF power of the top electrode to be grounded while blocking the RF of the bottom electrode.

Figure 4:
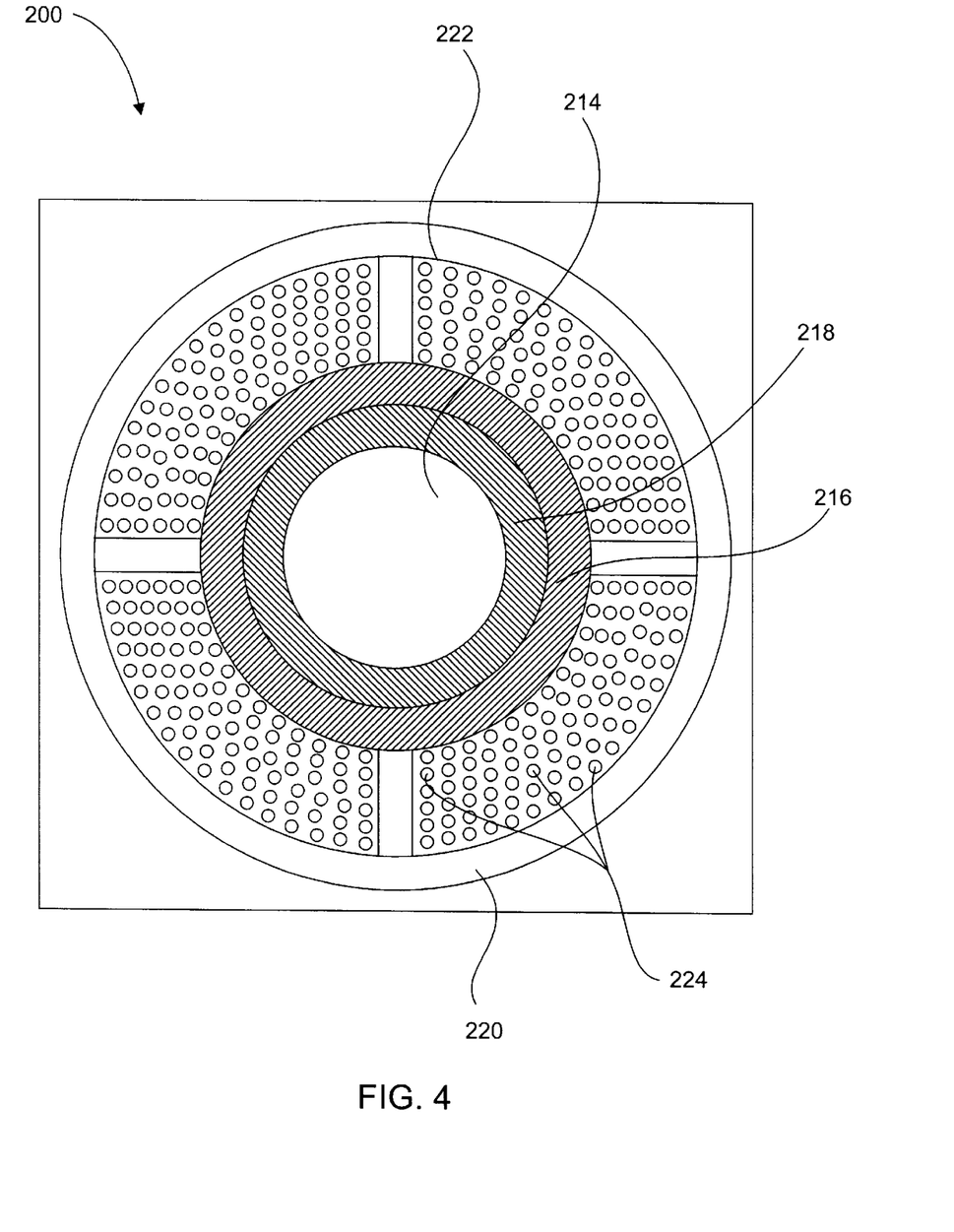
FIG. 4 shows a top view of a plasma processing reactor with the enhancements of the present invention.

FIG. 4 illustrates, in accordance with one embodiment of the present invention, the top view of plasma processing reactor 200 in more detail. Substrate 214 is secured in the reactor 200 by an electrostatic chuck (not shown). Focus ring 216 surrounds the electrostatic chuck. Silicon ring 218 is shown disposed between substrate 214 and focus ring 216. Insulating shroud 220, which projects out of the page, lines the interior of reactor 200. Perforated plasma confinement ring 222 outer periphery is shown abutted to the insulating shroud 220. However, it is possible for the outer periphery of perforated plasma confinement ring 222 to extend beyond the inner periphery of insulating shroud 220, in which case insulating shroud 220 sits on perforated plasma confinement ring 222 during etching. Perforated plasma confinement ring 222 inner periphery is abutted to the outer periphery of focus ring 216, if present. Perforated plasma confinement ring 222 includes perforations 224. It should be noted that the abutted surfaces in the above description may include a gap, between the perforated plasma confinement ring and its adjacent structures, that is sufficiently narrow to still keep the plasma substantially confined.

To elaborate further, the introduction of a grounded perforated plasma confinement ring allows the electrons to flow from the plasma to ground. Grounding the perforated plasma confinement ring removes electrons from the chamber and therefore reduces the density of the plasma. A reduction in plasma density tends to increase the energy of the ions in the plasma. While not wishing to be bound by theory, it is believed that the increase in ion energy allows for a greater impact on the substrate surface when the ions are accelerated and bombard the substrate. This mechanism is believed to produce higher aspect ratios for small feature sizes while substantially maintaining straight profiles. The invention preferably uses SiC for the perforated plasma confinement ring. However, it should be stated that the perforated plasma confinement ring may be formed from any conductor that is substantially resistant to etching by a plasma present within the chamber during processing and/or to contribute substantially no metal contamination. In one embodiment, the perforated plasma confinement ring has a thickness between about ¼ and 2 inches. The thickness is dependent on the material used and other manufacturing concerns.

By confining the plasma inside the volume defined approximately by the top electrode, the insulating shroud, the bottom electrode and the perforated plasma confinement ring, a more uniform etch can be achieved, wherein the center and the edge of the substrate have substantially the same etch rate. Perforations inside the perforated plasma confinement ring are preferably dimensioned to allow the by-product gas to pass through without placing undue demand on the pumping arrangement. At the same time, the perforations must be dimensioned to confine the plasma to the aforementioned volume. This reduces the possibilities of unconfinement which can cause contamination and RF mismatch while maximizing etch rate and etch uniformity.

Figure 5A:
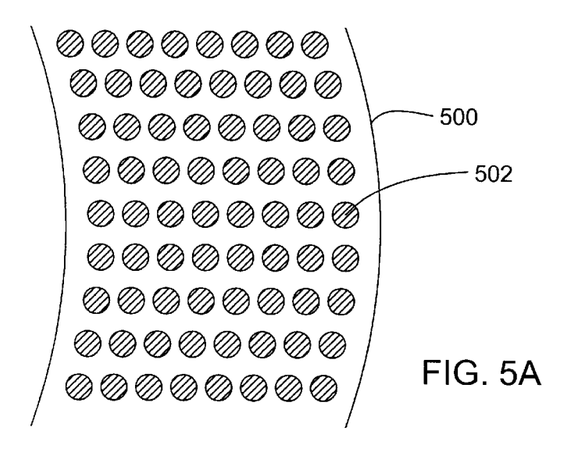
FIGS. 5a–5c illustrate, in accordance with embodiments of the present invention, various grid designs for the perforated plasma confinement ring.
Figure 5B:
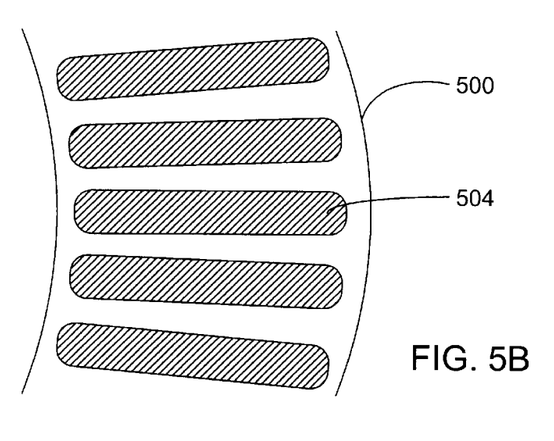
Figure 5C:
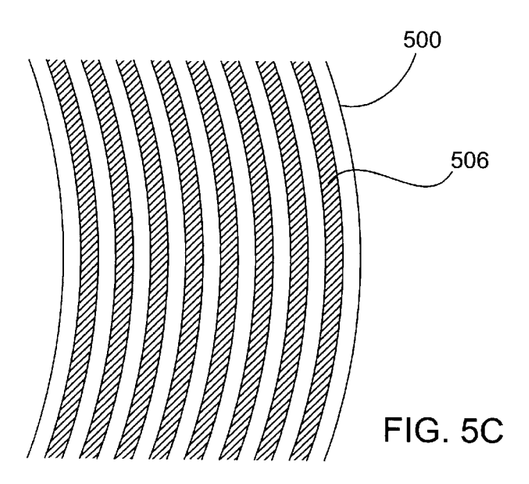

Preferably the perforated plasma confinement ring should have the number of perforations effective to allow the by-product gas to be exhausted and the plasma to be substantially confined. The perforations are not limited to any particular shape and can be patterned to be circular, slotted, concentric and the like. Three shapes are shown in FIGS. 5a–c in accordance with preferred embodiments of the present invention. The present invention employs, in one embodiment, about 2000 circularly shaped perforations in the perforated plasma confinement ring. FIG. 5a shows a perforated plasma confinement ring 500 with circularly shaped perforations 502. The circularly shaped perforation size can vary, but a preferable range was found to be between about 1/16 and about 1/8 of an inch in diameter and preferably about 3/32 inches in diameter. In another embodiment, the perforated plasma confinement ring employs about 200 slotted perforations FIG. 5b shows a perforated plasma confinement ring 500 with slotted perforations 504. The width of the slotted perforations can vary, but a preferable range was found to be between about 1/8 and about 1/32 of an inch and preferably about 1/16 inches. In yet another embodiment, the perforated plasma confinement ring employs about 10 concentric ring perforations. FIG. 5c shows a perforated plasma confinement ring 500 with concentric ring perforations 506. The gap between the concentric ring perforations may be between about 1/32 and about 1/8 of an inch.

The percentage of the open area in the perforated plasma confinement ring is a critical parameter. By way of example, a 20% open area yields unacceptable etch results while a 50% open area improves the etch profile. In a preferred embodiment, the percentage of the open area in the perforated plasma confinement ring is above about 20%. In a preferred embodiment, the percentage of the open area in the perforated plasma confinement ring is preferably at about 50%. In general, it is discovered that the percentage of the open area should be tailored to individual chamber designs within the guidelines stated, i.e., a balance must be maintained between having a sufficient percentage of the open area to permit the turbomolecular pump to effectively remove the exhaust byproduct gases and maintain the desired chamber pressure while maintaining the structural integrity of the perforated plasma confinement ring and more importantly, substantially confining the plasma to the upstream side of the perforated plasma confinement ring (as seen along the byproduct gas exhaust path).

Preferably, the perforated plasma confinement ring should substantially fill the gap made between the inside periphery of the insulating shroud and the outer periphery of the electrostatic chuck to allow substantially all the exhaust gases to pass through the perforated plasma confinement ring. The outer diameter of the perforated plasma confinement ring should be sized to fit within the inner diameter of the insulating shroud, so long as it is abutted to the insulating shroud or has a gap, between the perforated plasma confinement ring and the insulating shroud, that is sufficiently narrow to still keep the plasma substantially confined. The outer periphery of the electrostatic chuck may include the focus ring, but the focus ring is not required at all times. If the focus ring and/or the silicon ring is omitted, the inner periphery of the perforated plasma confinement ring is preferably dimensioned to fit around the bottom electrode or has a gap, between the perforated plasma confinement ring and the bottom electrode, that is sufficiently narrow to still keep the plasma substantially confined. The contact surface between the perforated plasma confinement ring and the bottom electrode should be electrically insulated as is well known in the art.

In one aspect of the invention, the perforated plasma confinement ring is placed at a location inside the processing chamber where it can exhaust by-product gas efficiently without causing contamination of the substrate. Structures that are placed above the substrate during processing tend to cause contamination of the substrate. This is because such structures may present sites or surfaces for adsorbed materials to attach. Over time, the adsorbed materials may flake off onto the substrate, causing particulate contamination. Therefore, the placement of the perforated plasma confinement ring is crucial for reducing part contamination. Preferably, the perforated plasma confinement ring should be placed downstream from the substrate. The preferred arrangement is for the perforated plasma confinement ring to be disposed about level with or more preferably below the top surface of the substrate a distance between about 0 to 4 inches.

In accordance with one embodiment of the present invention, the insulating shroud is configured to be electrically floating which prevents the plasma from grounding through the chamber walls. The insulating shroud also has the purpose of confining the plasma to a specific volume inside the chamber and can be dimensioned according to the volume needed. As mentioned earlier, in the discussion of the perforated plasma confinement ring, when the volume of the plasma is controlled and confined, the etching tends to be more uniform. The insulating shroud is preferably formed from a material that is substantially resistant to etching by the plasma present within the chamber. Note that the material can be either a conductor or insulator since it is electrically floating. The insulating shroud should be formed of a material that is able to withstand the plasma environment without unduly contaminating the substrate. In one embodiment quartz is employed but other materials such as SiC, graphite or Vespel® by Dupont Chemical Corporation of Delaware may also be employed.

Also, the insulating shroud is easily removable from the processing chamber. Removing the insulating shroud enables the plasma reactor to have less downtime because a clean shroud can be placed in the chamber while the dirty one is cleaned. The inner diameter of the insulating shroud can be larger or smaller than the outer diameter of the perforated plasma confinement ring, as long the gap (if any) between the insulating shroud and the perforated plasma confinement ring can keep the plasma contained.

In another embodiment the frequency of the electrodes in the parallel plate reactor are set at frequencies found to work advantageously with the inventive perforated plasma confinement ring and/or gap distance to etch the silicon-dioxide layer. The frequency of the power used in plasma processing is an important feature of process design. In the present invention, the top electrode frequency is about 27 MHz and the bottom electrode frequency, which is lower than the top electrode frequency, is about 2 MHz.

Preferably the distance between the top and bottom electrodes is adjustable between about 0.5 and 2 inches during etching of the silicon-dioxide containing layer. As discussed blow, it is found that the combination of the two frequencies of about 27 MHz and 2 MHz, the gap between about 0.5 and 2 inches, and the use of the perforated plasma confinement ring in the manner disclosed enables the silicon-dioxide containing layer to be etched with surprising advantageous results.

In one specific application of this invention, a 200 mm substrate having thereon a dielectric layer, e.g., a silicon-dioxide containing layer (e.g., TEOS, BPSG, thermal oxide or the like) is etched in the aforementioned plasma processing reactor system. However, this invention is not limited to a particular sized substrate. The mask material represents a photoresist layer and the etchant includes a fluorocarbon-containing gas (e.g., a fluorocarbon gas such as C4F8).

The top RF power source level is about 1000 watts. The bottom power level source is about 2000 watts. However, both RF power source levels may be optimized to achieve a suitable overall dielectric etch rate, photoresist selectivity, and to maintain the desired etch profile in a given system and/or for a given substrate stack.

The first electrode which is coupled to the first RF power source operates at a temperature of about 40 degrees Celsius and the second electrode which is coupled to the second RF power source operates at a temperature of about 20 degrees Celsius. The bottom electrode is He cooled. The gap between the first and second electrode is about 2 cm.

The pressure within the aforementioned plasma processing reactor system is maintained at about 30 mT during etching. Argon is flowed into the processing chamber at about 150 standard cubic centimeters per minute (sccm), Nitrogen is flowed at about 20 sccm, C4F8 is flowed at about 12 sccm, and Oxygen is flowed at about 4 sccm.

It is observed that the present invention gives the ability to etch smaller features with high aspect ratios. The present invention is capable of etching feature sizes of 0.25 microns or smaller while increasing the aspect ratios from about 4:1 to about 8:1 over the prior art without significant adverse impact on the selectivity and/or the etch rate. Also, uniform etching from the center to the edge of the substrate is achieved by confining the plasma and controlling its volume. Another distinct advantage of the new invention is that it tends to reduce particle contamination and contributes to improved etch uniformity by placing the perforated plasma confinement ring down stream of the substrate.

While this invention has been described in terms of several preferred embodiments, there are alterations, permutations, and equivalents which fall within the scope of this invention. By way of example, although an advantageous etch recipe has been disclosed for etching through the silicon-dioxide containing layer, the inventive plasma processing chamber can be configured to etch any layer, using conventionally known and appropriate etchants and suitable parameters (which can be empirically determined). It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of processing a substrate with a plasma, comprising:

generating the plasma;

confining the plasma within a volume defined at least by an electrically insulated or electrically floating chamber wall and an electrically conductive perforated confinement ring that is electrically grounded, the perforated confinement ring being disposed in its entirety at or below a top surface of the substrate during processing; and removing electrons from the plasma through the confinement ring to ground so as to increase ion energy during processing.

2. The method as recited in claim 1 wherein the perforated confinement ring is disposed between the chamber wall and an electrode during processing.

3. The method as recited in claim 1 wherein the perforated confinement ring surrounds the outer periphery of the electrode during processing.

4. The method as recited in claim 1 wherein the perforated confinement ring is positioned relative to the substrate so as to prevent contamination of the substrate during processing.

5. The method as recited in claim 1 wherein the chamber wall and the perforated confinement ring are formed from a material that is substantially resistant to etching by the confined plasma.

6. The method as recited in claim 5 wherein the perforated confinement ring is formed from SiC.

7. The method as recited in claim 1 wherein the electrically insulated chamber all or the electrically floating chamber wall prevents the plasma from grounding herethrough.

8. The method as recited in claim 1 wherein the chamber wall is an insulating shroud that lines a portion of a process chamber.

9. The method as recited in claim 8 wherein the insulating shroud is removable from the process chamber.

10. The method as recited in claim 1 further comprising:

providing a plasma reactor that includes a process chamber, a bottom electrode coupled to a first RF power source and a top electrode coupled to a second RF power source.

11. The method as recited in claim 10 wherein the plasma is generated by flowing a process gas into the process chamber, and powering the electrodes via their respective power sources.

12. The method as recited in claim 11 wherein the frequency of the bottom electrode is lower than the frequency of the top electrode.

13. The method as recited in claim 12 wherein the frequency of the top electrode is 27 MHz and wherein the frequency of the bottom electrode is 2 MHz.

14. The method as recited in claim 11 wherein the process gas includes a fluorocarbon containing gas.

15. The method as recited in claim 14 wherein the fluorocarbon gas is C4F8.

16. The method as recited in claim 14 wherein the process gas further includes Argon, Nitrogen and Oxygen.

17. The method as recited in claim 1 wherein the substrate includes a dielectric layer that is etched by the plasma.

18. The method as recited in claim 17 wherein the dielectric layer is TEOS, BPSG or thermal oxide.

* * * * *